US008151165B2

(12) United States Patent
Belogolovy et al.

(10) Patent No.: US 8,151,165 B2
(45) Date of Patent: Apr. 3, 2012

(54) MODIFICATION TO MEGGITT DECODER FOR BURST ERROR CORRECTION CODES

(75) Inventors: Andrey Vladimirovich Belogolovy, Saint Petersburg (RU); Andrei Anatol'evich Ovchinnikov, St. Petersburg (RU); Andrey Gennadievich Efimov, St. Petersburg (RU)

(73) Assignee: Intel Corporation, Santa Clara, CA (US)

( * ) Notice: Subject to any disclaimer, the term of this patent is extended or adjusted under 35 U.S.C. 154(b) by 679 days.

(21) Appl. No.: 12/305,964

(22) PCT Filed: Jun. 28, 2006

(86) PCT No.: PCT/RU2006/000338

§ 371 (c)(1), (2), (4) Date: Feb. 24, 2009

(87) PCT Pub. No.: WO2008/002174

PCT Pub. Date: Jan. 3, 2008

(65) Prior Publication Data

US 2010/0031120 A1 Feb. 4, 2010

(51) Int. Cl.
*H03M 13/00* (2006.01)

(52) U.S. Cl. .......................................................... 714/762

(58) Field of Classification Search .................. 714/762
See application file for complete search history.

(56) References Cited

U.S. PATENT DOCUMENTS 3,162,837 A * 12/1964 Meggitt ........................ 714/762
4,032,886 A * 6/1977 En et al. ........................ 714/788
4,916,701 A * 4/1990 Eggenberger et al. ........ 714/758
5,136,592 A * 8/1992 Weng ........................... 714/762
5,280,488 A * 1/1994 Glover et al. ................. 714/784
5,600,653 A * 2/1997 Chitre et al. .................. 370/474
5,657,331 A * 8/1997 Metzner et al. ............... 714/762
5,659,557 A * 8/1997 Glover et al. ................. 714/752
5,881,073 A * 3/1999 Wan et al. ..................... 714/786
6,662,332 B1 * 12/2003 Kimmitt ....................... 714/762
6,779,149 B1 * 8/2004 Dong ............................ 714/762
6,990,625 B2 * 1/2006 Fujiwara et al. .............. 714/788
7,130,257 B2 * 10/2006 Taguchi et al. ............ 369/59.22
7,334,059 B2 * 2/2008 Moyer ............................ 710/35
7,802,167 B1 * 9/2010 Gorshe ......................... 714/762
2008/0082896 A1 * 4/2008 Valliappan et al. ........... 714/762

OTHER PUBLICATIONS

Belogolovy, A., et al., "Forward Error correction proposal for 10G Backplane Ethernet", (Sep. 10, 2005), p. 6.
Chen, J., et al., "A Burst-Error-Correcting Algorithm for Reed-Solomon codes", IEEE Transactions on Information Theory, 38(6), (Nov. 1, 1992), 1807-1812.
Yin, L., et al., "A Fast Decoding Algorithm for reed-solomon codes with enhanced burst correcting capability", VTC Fall 2001, IEEE 54th, Vehicular Technology Conference, Proceedings, vol. 1 of 4, (Oct. 7, 2001), 1477-1481.
"Chinese Application Serial No. 200680054771.2, Response filed Sep. 13, 2011 to Office Action mailed Feb. 24, 2011", (w/ English Translation of Amended Claims), 13 pgs.
"Chinese Application Serial No. 200680054771.2, Non Final Office Action mailed Feb. 24, 2011", and English translation, 14 pgs.
Belogolovy, Andrey, et al., "Forward Error Correction proposal for 10G Backplane Ethernet", IEEE802.3ap Interim Meeting Nashua NH,, 802.3ap FEC Proposal, (Sep. 2005), 24 pgs.

* cited by examiner

*Primary Examiner* — Yolanda L Wilson
(74) *Attorney, Agent, or Firm* — Schwegman, Lundberg & Woessner, P.A.

(57) ABSTRACT

Apparatus and methods are provided to correct burst errors from a communication channel. Embodiments may include correcting burst errors in received data using a decoder configured as a Meggitt decoder with an additional selection criterion to correct a burst error having a length larger than the code error correction capability.

20 Claims, 4 Drawing Sheets

200
RECEIVED VECTOR
210 SYNDROME CALCULATOR
220 COMPARISON CIRCUITRY
230 WEIGHT DETERMINATION CIRCUITRY
240 CODEWORD BUFFER
245
DECODED VECTOR

MODIFICATION TO MEGGITT DECODER FOR BURST ERROR CORRECTION CODES

RELATED APPLICATION

This application is a U.S. National Stage Filing under 35 U.S.C. 371 from International Patent Application Serial No. PCT/RU2006/000338, filed Jun. 28, 2006, and published on Jan. 3, 2008 as WO 2008/002174 A1, which is incorporated herein by reference.

TECHNICAL FIELD

Embodiments of the invention relate generally to decoding communication signals.

BACKGROUND

A communication channel, whether it is a fiber optic channel, a coaxial channel, a wired channel, a wireless channel, or a bus connecting locations in a system over which large amounts of data are transferred, can add noise and error to information being transmitted over the channel. To correct for errors added by the communication channel, information can be sent in the form of codewords, where each codeword contains the same number of total bits and in which a number of the bits are information (message) bits and a number of bits are used for error correction. A codeword having a length of n bits includes k bits for the message length of the code and r=n−k redundant bits. The r bits are for correction and may be r parity check bits. A parity check matrix, H, contains a set of parity check equations that define the codeword according to the relation:

$$HC^T=0,$$

where C is the n-dimensional vector of the codeword bits. At a receiver, if this relation is not satisfied, then the received codeword is not valid and must either be corrected or retransmitted.

A variety of schemes for decoding a codeword that has propagated through a communication channel exist. Such schemes include error correction for data transmission over a backplane of a system. Some schemes may provide accuracy and other schemes may provide fast decoding. In high speed data communication what is needed is a decoding scheme that is accurate and fast, but at the same time can be implemented without a significant amount of complexity.

DETAILED DESCRIPTION

Figure 1:
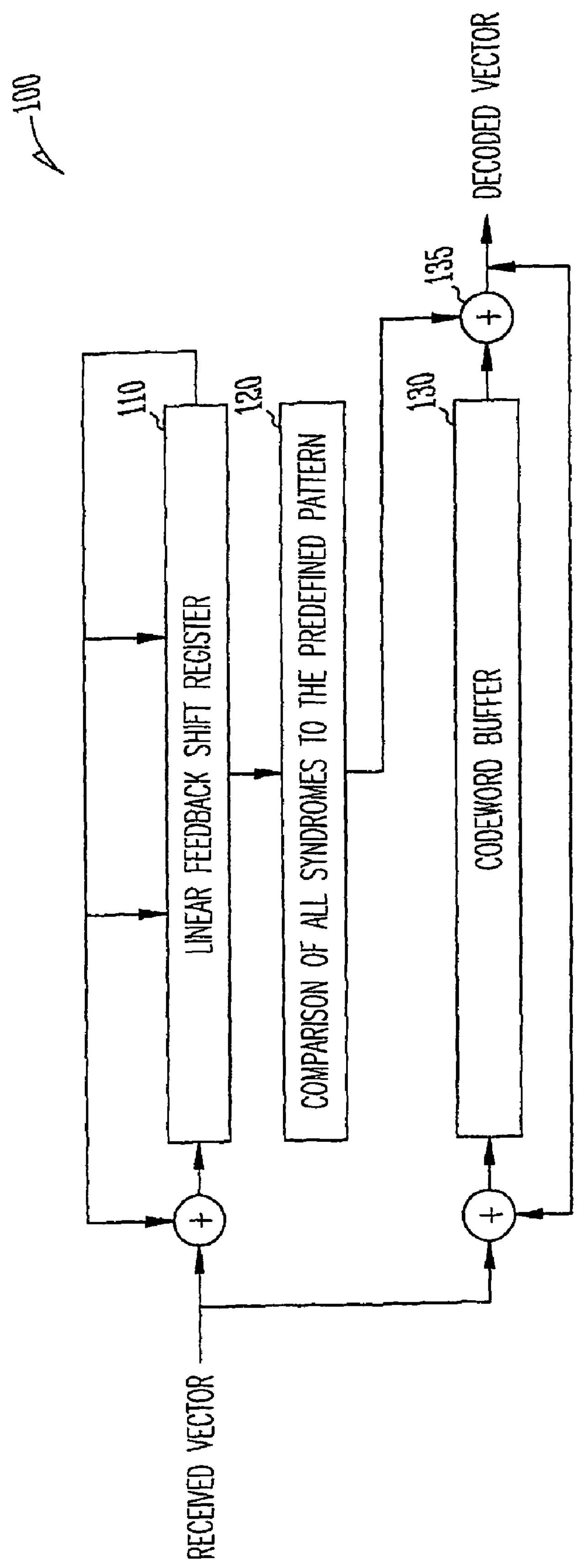
FIG. 1 shows a representation of a traditional Meggitt decoder.

The following detailed description refers to the accompanying drawings that show, by way of illustration, specific details and embodiments in which the invention may be practiced. These embodiments are described in sufficient detail to enable those skilled in the art to practice the present invention. Other embodiments may be utilized, and structural, logical, and electrical changes may be made without departing from the scope of the invention. The various embodiments disclosed herein are not necessarily mutually exclusive, as some embodiments can be combined with one or more other embodiments to form new embodiments. The following detailed description is, therefore, not to be taken in a limiting sense.

Typically, errors in communication channels tend to occur in bursts. In some applications in which information is received over a data transmission channel, an error burst is a contiguous sequence of symbols with the first and last symbols being in error without a contiguous subsequence of correctly received symbols. The data transmission channel may be a backplane of a system having multiple interface devices that may communicate with each other or with devices on another system via a network transmission medium. A code, known as a Fire code, can correct all burst errors of length N or less, where N is a strict parameter of the Fire code defined by its generator polynomial. A Fire code is a cyclic burst-correcting code over a field, GF(q), with a generator polynomial, g(x), where GF(q) is a finite field having q elements and g(x) is given by $$g(x)=(x^{2N-1}-1)p(x), \qquad \text{Equation (1)}$$

with p(x) is a prime polynomial over GF(q) having degree m not smaller than N and p(x) does not divide $x^{2N-1}-1$.

Traditionally, Fire codes are decoded with a Meggitt decoder that corrects error bursts up to N. This traditional decoder will make a correct decision if the error burst length is less than or equal to N and will typically fail if the error burst length is larger than N. In an embodiment, a probabilistic approach to the Fire code decoding may be implemented. Such a probabilistic approach includes a method having the following feature: if a error burst is larger than the code error-correction capability, N, up to some threshold, it is possible to correct the error burst with some probability not much less that 1.0 by selection of an error vector from a plurality of error vectors using a selection criterion. In an embodiment, an error burst may be corrected with some probability not much less 1.0 by selection of an error vector by a minimal Hamming-weight principle. For error bursts that are within a threshold that is limited in size to a number, which is a small amount larger than the code error-correction capability N, averaged results may be better than traditional decoding results.

Currently, burst error correction code (2112, 2080) is part of a draft of a standard from a task force of the Institute of Electrical and Electronics Engineers (IEEE), IEEE 802.3ap/Draft 2.4 on Backplane Ethernet published on or about 28 Apr. 2006. This code may be used as a forward error correction solution for a 10 Gigabit (10 G) backplane Ethernet. Burst error correction code (2112, 2080) is a shortened linear cyclic code. The code encodes 2080 bits of payload, which are information, and adds 32 overhead bits, which are parity bits. The code is systematic, which means that the information bits are not disturbed in the encoder and the parity bits are added separately at an end of the 2080 block of information bits. Systematic form of the codeword allows the first 2080 information bits of the codeword to be extracted directly. The (2112, 2080) code is constructed by shortening the cyclic code (42987, 42955) and is guaranteed to correct an error burst up to 11 bits per block. As a systematic code, it is suited to correct burst errors typical in a backplane channel. The generator polynomial g(x) for the (2112, 2080) parity check bits may be given as $$g(x)=x^{32}+x^{23}+x^{21}+x^{11}+x^{2}+1 \quad \text{Equation (2)}$$

If the polynomial representation of information bits is denoted as m(x), the codeword denoted as c(x) can be calculated in systematic form as $$p(x)=x^{32}m(x) \bmod g(x) \quad \text{Equation (3)}$$

$$c(x)=p(x)+x^{32}m(x) \quad \text{Equation (4)}$$

Multiplication on $x^{32}$ may be performed using shifts.

Traditionally, a Meggitt decoder is used for error correction of a code at a receiving side of an apparatus or system in which the maximum burst error length correctable by the code can be determined. The maximum burst error length is based on the code's generator polynomial or parity-check matrix. Herein, the term maximum burst error length is used to define the strict parameter for which code correction is guaranteed for a code, which may also be expressed as the code error-correction capability. The maximum burst error length or code error-correction capability for the (2112, 2080) code is 11, based on its generator polynomial or its parity-check matrix.

Denote the codeword by $C=\{c_0 \ldots c_{n-1}\}$, where n is the code length. This codeword may also be represented in a polynomial representation as $C=C(x)=c_0+c_1x+\ldots c_{n-1}x_{n-1}$. If g(x) is the code generator polynomial or H is the code parity check matrix, then S(x)=C(x) mod g(x) or $S=CH^T$ is the syndrome of the codeword. For a codeword, the syndrome is always equal to zero. When the syndrome is not zero, then what is provided as the codeword, for example, a received codeword from a channel such as a backplane channel, is not the codeword but may be the codeword with error added. A nonzero syndrome depends on an error pattern.

For any vector A that is the sum of codeword C and some error E, where A=C+E, the syndrome is $AH^T=(C+E)H^T=EH^T$. The code is able to correct two different errors if they produce different syndromes. The set of vectors $\{A_i\}$ that have been obtained by adding different error vectors $E_i$ to the same codeword C are called a coset of vector C, $\{A_i\}=\{C+E_i\}$. Cosets have the following properties:

- Each coset consists of $2^k$ vectors (which corresponds to the number of codewords in code G).
- There exist $b_1, b_2, \ldots, b_{2^{n-k}-1}$ such that $G \cup \{b_1+G\} \cup \{b_2+G\} \cup \ldots \cup \{b_{2^{n-f}-1}+G\}$ includes all of the $2^n$ vectors in the vector space.
- Two cosets are either equal or disjoint (partial overlapping is impossible).
- All vectors in the coset have the same syndrome.

It is clear that $b_i$ must not be an element of G in order to generate all cosets of G (excluding b–0). If $b_i \in G$, then all vectors are in G.

Decoding a received vector using cosets may be performed in the following manner. The cosets are ordered such that the vector with the smallest weight is placed in the first column. A Hamming weight of a vector, for example, is the number of nonzero coordinates in the vector. If two or more vectors within one coset have the same weight, their order of representation may be randomly determined. The coset leader is defined as the first vector in a coset Decoding a received vector A=C+E consists of finding the coset that contains the vector A. The coset leader of this set corresponds to the error with the smallest weight (and largest probability) that can be added to a codeword to give the received error vector. This method of decoding is called standard array decoding, and is clearly a maximum likelihood (ML) decoding method. In practice, standard array decoding is implemented for short codes.

As an example of a standard array, consider a given (4, 2) code having the four codewords: (0000) (0011) (1100) (1111). The standard array consists of four cosets b=(0000): {(0000), (0011), (1100), (1111)}
b=(1000): {(1000), (1011), (0100), (0111)}
b=(0010):{(0010),(0001),(1110),(1101)}
b=(1001): {(1001), (1010),(0101),(0110)}.

The minimal-weight coset leaders used to generate the cosets in this example are not unique. This is expected because the minimum distance of this code is 2 (no error correction). The distance between two vectors is the number of coordinates in which the two vectors differ. The minimum distance of a code is the smallest distance between the distinct codewords of the code. If b=(0100) is added to G, the coset {(0100) (0111) (1000) (1011)} is obtained. This generates the same coset as from the vector b=(1000). To correct an error, the decoder should find an error vector in the coset defined by its syndrome.

The code can correct burst errors if the coset leaders in its standard array may be described as bursts. If all possible error bursts up to given length b are coset leaders, then the code can correct bursts of length up to b. The parameter b is called the maximum burst length.

The traditional Meggitt decoder for code (2112, 2080) corrects error bursts with length up to 11. This means that all error bursts of length 11 are coset leaders, and there are no two bursts of length 11 in the same coset. As a result, the decoder can uniquely define the leader of the coset by its syndrome. As noted, the value 11 may be defined by the code generator polynomial via the Fire theorem. For example, see R. Blahut, *Theory and Practice of Error Control Codes*, Addison-Wesley, 1984.

For error bursts of length greater than the maximum burst length, for example, a length 12 for code (2112, 2080), there may be error vectors with burst length 12 in the same coset and therefore with the same syndrome. In such a case, the traditional standard array approach typically does not work.

In an embodiment, a modification to the Meggitt decoder is made to correct error bursts with length larger than the maximum burst length. This modification may include adding an additional rule to the decoder that if there are multiple different error bursts in the coset having the same burst length, then the decoder should select the vector with the lowest Hamming weight as the error and correct it. This modification is applicable to the (2112, 2080) code Meggitt decoder having a maximum burst length of 11 and may function with a 2 codeword delay. In an embodiment, the modified Meggitt decoder for the (2112, 2080) code may correct burst errors having lengths of 13 or less.

FIG. 1 shows a block diagram of a traditional Meggitt decoder 100 to correct error bursts of length up and including the code burst error correction capability. Traditional Meggitt decoder 100 may be implemented to correct error bursts of length up to 11 for the (2112, 2080) code. Traditional Meggitt decoder 100 includes a linear feedback shift register (LFSR) 110 that divides by the generator polynomial of the (2112, 2080) code. A comparison 120 of all syndromes to a predefined pattern is performed by decoder 100. Comparison 120 compares the oldest syndrome bits to zero. The result from comparison 120 is provided to a summer 135 along with data from codeword buffer 130 to provide a decoded vector from summer 135.

Figure 2:
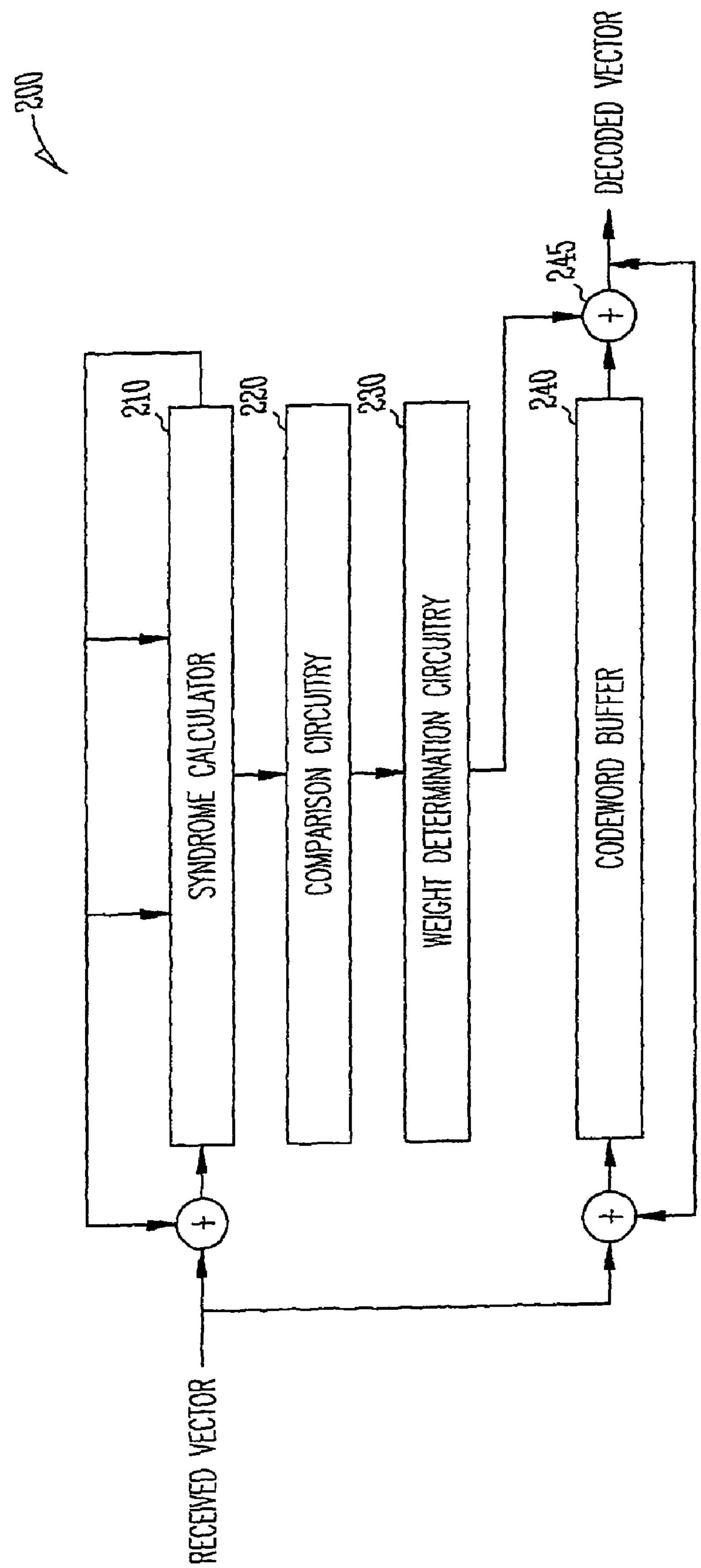
FIG. 2 shows an embodiment of a Meggitt decoder having circuitry to correct error bursts of length greater than the code error correction capability of a predetermined code.

FIG. 2 shows an embodiment of a Meggitt decoder 200 having circuitry to correct error bursts of length greater than the maximum burst length of a predetermined code. Modified Meggitt decoder 200 includes a syndrome calculator 210. Syndrome calculator 210 may be implemented as a linear feedback shift register that divides by the generator polynomial of the code. Comparison circuitry 220 provides a comparison of all syndromes to a predefined pattern. Comparison circuitry 220 compares the oldest syndrome bits to zero. Comparison circuitry 220 may be implemented with various forms of logic circuitry as can be appreciated by those skilled in the art. A weight determination circuitry 230 finds the minimum Hamming-weight pattern. Error positions that produce error burst of length equal to or less than a threshold limit for burst correction length are stored. The threshold limit is greater than maximum burst length. Various methods and apparatus may be used to determine the minimum Hamming weight. For example, a process may start with some minimum weight value WM=2113 (codeword length+1) and error burst 000000..000 (all zeros), which may be placed in a storage unit such as a register. After finding a first burst candidate, its Hamming weight may be compared with the stored WM. If the Hamming weight of a new vector being examined is smaller, then the storage unit may be updated with the minimum weight value of the current analyzed vector and a storage unite may also be updated to store the associated error burst. This process may be repeated until all error bursts found. Weight determination 230 may be realized as storage units and comparators, which may be implemented in various forms of logic circuitry, as can be appreciated by those skilled in the art. Selection of an error vector with a minimum Hamming-weight from determination 230 may be provided to a summer 245 along with data from codeword buffer 240 to provide a decoded vector from summer 245. From review of FIGS. 1 and 2, an embodiment using a modified Meggitt decoder may function with a 2 codeword delay.

In a process using the rule added to modify Meggitt correction decoding, it may happen that a longer error burst may have lower Hamming weight such that the decoding will not correct the error that occurred but will instead correct its wrong syndrome image. For example, in a modified Meggitt decoding process to correct error bursts with length up to 13, for error burst 111111111111 (12 error bits) it may happen that there will be two error vectors that have the same syndrome, where one error vector is 111111111111 (correct solution) and another error vector is, for example, 100000000001 that is equivalent to an error burst of 12. Based on the rule to correct the vector with minimum Harming weight, a decoder so modified will determine that the error was 1000000000001, and it will proceed to correct the wrong vector, resulting in an incorrect decoding. Thus, a decoder modified to have a length of burst error correction for a code increased above a threshold, which is greater the maximum burst length for the code, will inject new errors instead of correcting real error bursts. In an embodiment, an additional rule is implemented that defines a threshold that is greater the maximum burst length for a given code for error correction limit, but provides an acceptable bit error rate (BER) for a given a signal-to-noise (SNR) value. In an embodiment, a criterion for a threshold may be set as the largest burst error length such that the BER over a range of SNR values is equal to or better than (less than) the BER over the same range of SNR values for operation at the error-correction capability for the code used. In various embodiments, other criteria may be used to determine such a threshold value. In an embodiment, the threshold limit of the error burst length for the code (2112, 2080) may be selected to equal 13. A threshold of 13 may be determined from simulations with different burst-length correction parameters.

Figure 3:
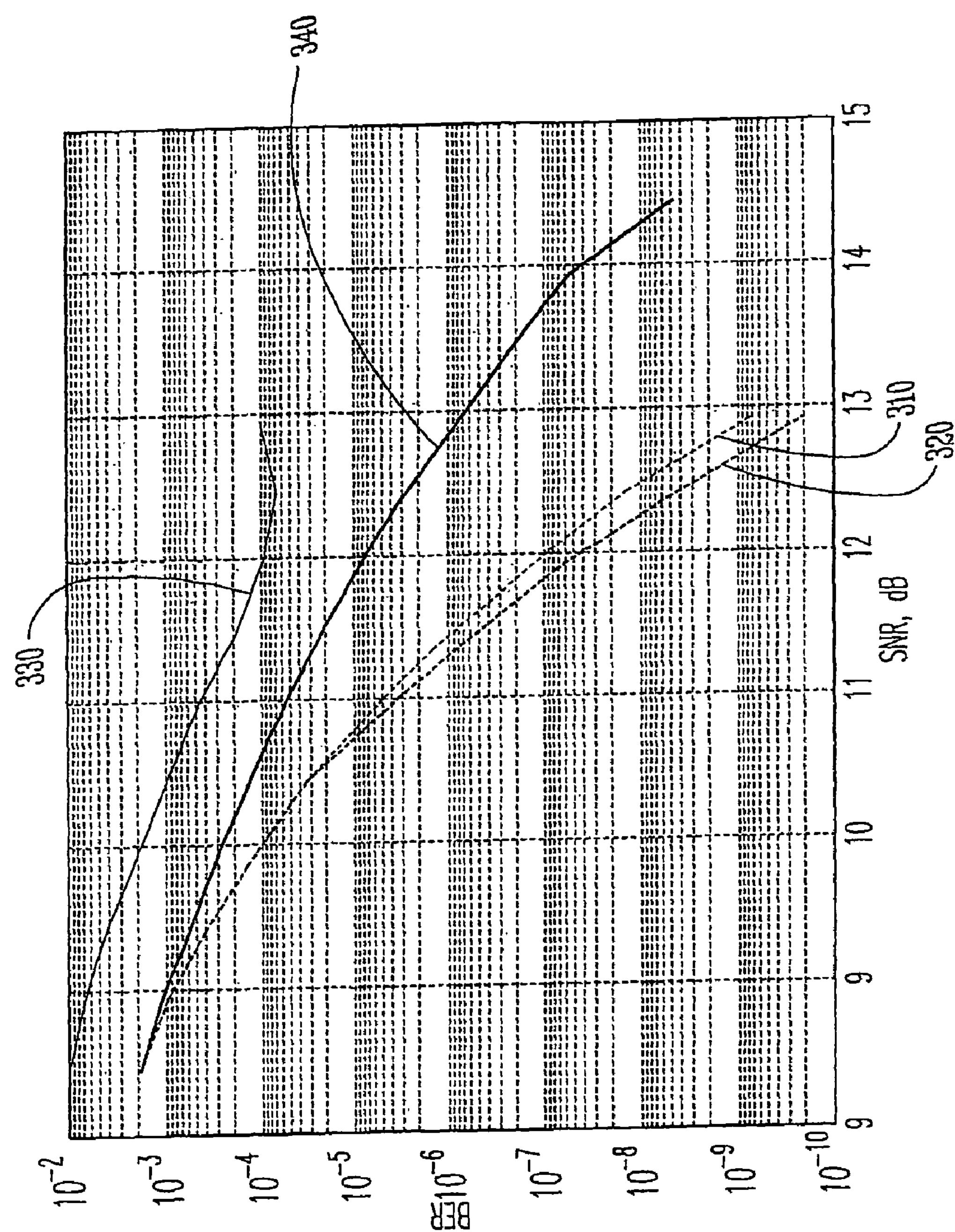
FIG. 3 shows results of simulations for the code (2112, 2080) for a traditional Meggitt decoder and embodiments of Meggitt decoders to correct error bursts of length greater than the code error correction capability for the code (2112, 2080).

FIG. 3 shows results of simulations of operation in a channel for the code (2112, 2080) as a plot of the BER vs SNR. Curve 310 provides the results using a traditional Meggitt decoder with the maximum burst length of 11. Curve 320 provides the results using an embodiment of a modified Meggitt decoder with a threshold limit of 13. Curve 330 provides the results using an embodiment of a modified Meggitt decoder with a threshold limit of 14. Curve 340 provides the results for uncoded operation. FIG. 3 demonstrates that the bit error rate curve 320 with modified Meggitt decoder for burst error length 13 shows 0.3 dB gain compared to curve 310 for a traditional Meggitt decoder. In various embodiments, modifications of a Meggitt decoder as provided herein may allow for decoding error bursts over the code burst error correction capability, that is, over the maximum burst length. An embodiment of a modified Meggitt decoder may provide the ability to decode errors that will not be decoded by a traditional Meggitt decoder. For the (2112, 2080) code, which is included in the draft, IEEE 802.3ap/Draft 2.4, on Backplane Ethernet, the resulting performance is increased by 0.3 dB using a threshold limit of 13.

Figure 4:
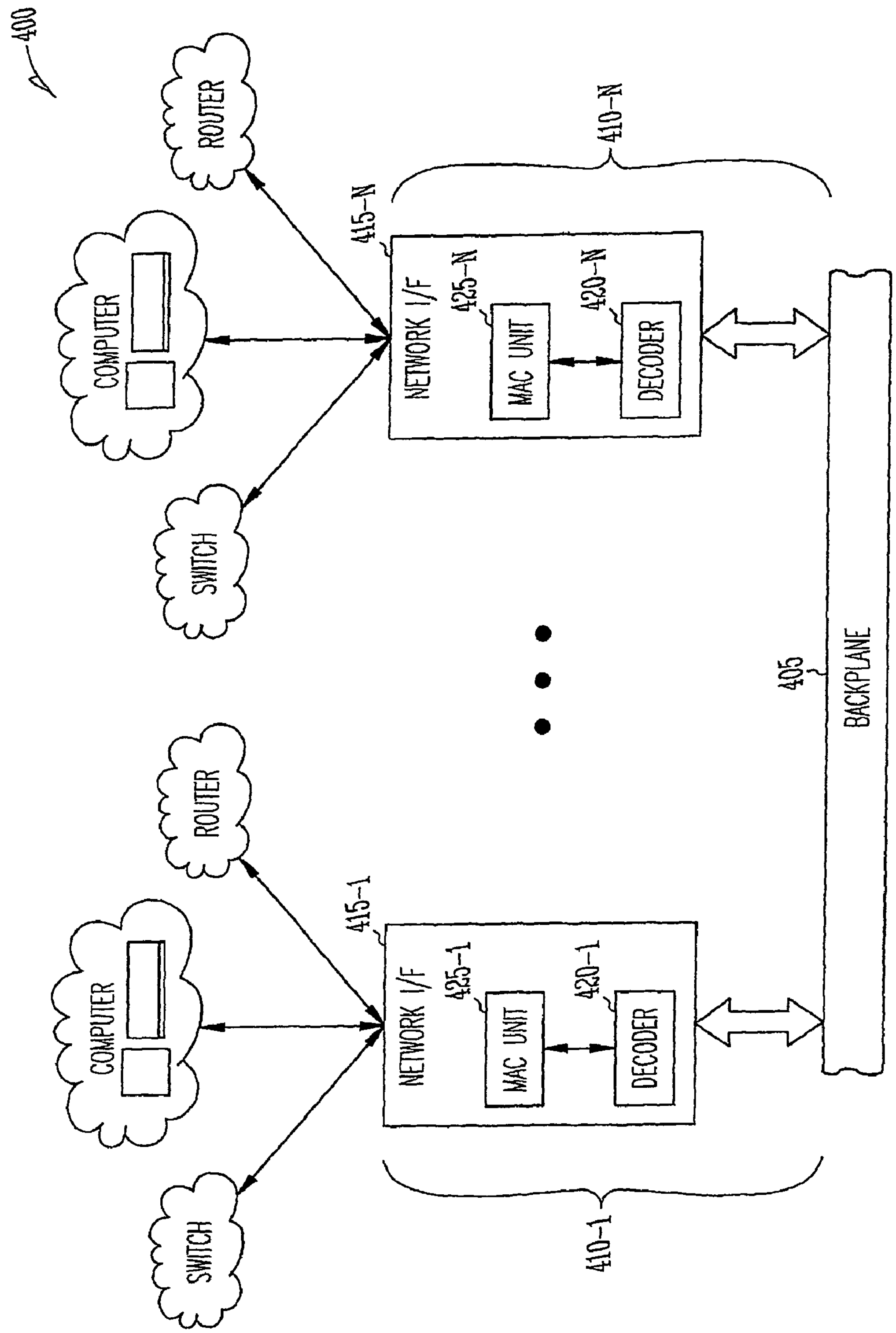
FIG. 4 illustrates an embodiment of a system having a decoder to correct burst errors of length larger than the code error correction capability.

FIG. 4 illustrates an embodiment of a system 400 having a decoder to correct burst errors of length larger than the code error correction capability. System 400 may include, but is not limited to, information handling devices, wireless systems, telecommunication systems, fiber optic systems, electro-optic systems, computers, and network storage systems. System 400 may include a number of devices 410-1 . . . 410-N coupled to and communicating through a backplane 405. Backplane 405 may be a passive backplane, active backplane, or a combination of a passive backplane and an active backplane. Passive backplanes typically offer no active bus driving circuitry. Active backplanes include active bus driving circuitry. Such active bus driving circuitry may include chips or chip sets that buffer various signals to different locations on the backplane. A chip is a semiconductor device. Separate semiconductor devices forming part of a family of chips is called a chip set. A chip set may be realized as a group of microchips designed to work and to be sold as a unit in performing one or more related functions.

Each device 410-1 . . . 410-N may include a network interface 415-1 . . . 415-N, respectively, each having a decoder 420-1 . . . 420-N, respectively. Each decoder 420-1 . . . 420-N may be configured as a forward error correction (FEC) decoder at a physical layer of its respective network interface 415-1 . . . 415-N. Each decoder 420-1 . . . 420-N may be arranged to correct burst errors of length larger than the code error correction capability. Each decoder 420-1 . . . 420-N may be a modified Meggitt decoder in accordance with various embodiments discussed herein. Network interface 415-1 . . . 415-N may be configured to provide communications between and among devices 415-1 . . . 415-N and/or with systems coupled to a network in common with system 400 or with systems on another network via a gateway device or system.

In various embodiments, one or more of network interfaces 415-1 . . . 415-N may represent a network interface suitable for use with a number of different Ethernet techniques as defined by the IEEE 802.3 series of standards. For example, one or more of network interfaces 415-1 . . . 415-N may comprise a structure arranged to operate in accordance with the IEEE Standard 802.3-2005 titled "IEEE Standard For Information Technology—Telecommunications and information exchange between systems—Local and metropolitan networks—Specific requirements Part 3: Carrier Sense Multiple Access with Collision Detection (CSMA/CD) Access Method and Physical Layer Specifications, Amendment: Ethernet Operation over Electrical Backplanes," Draft Amendment P802.3ap/Draft 2.4, 2006 ("Backplane Ethernet Specification"). The IEEE 802.3-2005 standard defines 1000 megabits per second (Mbps) operations (1000BASE-T) using four-pair twisted copper Category 5 wire, 10 Gbps operations using fiber cable, and 10 Gbps operations (10GBASE-CX4) using copper twin-axial cable (collectively referred to herein as "Gigabit Ethernet"). One or more of network interfaces 415-1 . . . 415-N are not necessarily limited to the techniques defined by these standards and may use other techniques and standards as desired for a given implementation.

Network interfaces 415-1 . . . 415-N may include a media access control (MAC) unit 425-1 . . . 425-N, where each operates with a physical (PHY) unit that includes its associated decoder 420-1 . . . 420-N. In various embodiments, MAC units 425-1 . . . 425-N and/or their associated physical units may be arranged to operate in accordance with one of the Ethernet architectures, such as the IEEE 802.3-2005 series of standards, including the Backplane Ethernet Specification. Backplane Ethernet combines the IEEE 802.3 MAC and MAC Control sublayers with a family of physical layers defined to support operation over a modular chassis backplane. Backplane Ethernet supports the IEEE 802.3 MAC operating at 1000 Mbps and/or 10 Gbps. For 1000 Mbps operation, the family of 1000BASE-X PHY signaling systems is extended to include 1000BASE-KX. For 10 Gbps operation, two PHY signaling systems are defined. For operation over four logical planes, the 10GBASE-X family is extended to include 10GBASE-KX4. For serial operation, the 10GBASE-R family is extended to include 10GBASE-KR (e.g., using various serializer/deserializer or "SERDES" techniques). Backplane Ethernet also specifies an Auto-Negotiation function to enable two devices that share a backplane link segment to automatically select the best mode of operation common to both devices.

With respect to the seven-layer Open System Interconnect (OSI) Reference Model developed by the International Standards Organization (ISO), each MAC unit 425-1 . . . 425-N may implement MAC layer operations. The MAC layer is a sublayer of the data link layer. The data link layer is primarily concerned with transforming a raw transmission facility into a communication line free of undetected transmission errors for use by the network layer. The data link layer accomplishes this task by breaking input data into data frames, transmitting the data frames sequentially, and processing acknowledgement frames. The MAC sublayer provides additional functionality concerned with controlling access to broadcast networks (e.g., Ethernet). In the case of Ethernet architecture, for example, the MAC sublayer may implement a CSMA/CD protocol.

The physical layer at which decoders 420-1 . . . 420-N receive their data is primarily concerned with transmitting raw bits from and to a physical medium. The physical medium may be connected to backplane 405. Such physical medium may include various media including, but not limited to, an optical fiber and a twisted-pair conductor. In an embodiment, a physical medium is a four-pair twisted conductor such as copper, conforming to a Category 5, 6, 7 or similar cable. In the four-pair twisted conductor embodiment, a physical layer converts digital data received from a MAC unit, such as 425-1 . . . 425-N, (e.g., 1000BASE-X or 10GBASE-X) into analog symbols (e.g., 1000BASE-T or 10GBASE-T) for transmission over the physical medium. A physical medium may operate at any number of bandwidths, including 100 Mbps, 1 Gbps, 10 Gbps, or other rates.

In an embodiment, system 400 may be configured as a communication system having multiple nodes. A node may comprise any physical or logical entity for communicating information in system 400 and may be implemented as hardware, software, or any combination thereof, as desired for a given set of design parameters or performance constraints. In various embodiments, a node may include, but is not limited to, a processing system, a computer system, a computer subsystem, a computer, a workstation, a terminal, a server, a bladed server, a modular server, a line card, a switching subsystem, a bridge, a router, a personal computer (PC), a laptop computer, an ultra-laptop computer, a portable computer, a handheld computer, and a personal digital assistant (PDA). In various embodiments, a node may be implemented as software, a software module, an application, a program, a subroutine, an instruction set, computing code, words, values, symbols or combinations thereof. A node may be implemented according to a predefined computer language, manner or syntax, for instructing a processor to perform a certain function.

System 400 may be implemented as a wired communication system, a wireless communication system, or a combination of both a wired and a wireless system. When implemented as a wired system, system 400 may include one or more nodes arranged to communicate information over one or more wired communications media. The communications media may be copper based or optical fiber based. Such an optical fiber system may include a SONET based system. Examples of wired communications media may include, but are not limited to, a twisted-pair wire, a coaxial cable, an optical fiber, and a switch fabric, which may be coupled to a backplane. When implemented as a wireless system, system 400 may include one or more wireless nodes arranged to communicate information over one or more types of wireless communication media. An example of a wireless communication media may include portions of a wireless spectrum, such as the radio-frequency (RF) spectrum. The wireless nodes may include components and interfaces suitable for communicating information signals over the designated wireless spectrum, such as one or more antennas, wireless transceivers, amplifiers, filters, control logic, and so forth. The term "transceiver" may be used in a general sense to include a transmitter, a receiver, or a combination of both. Examples for the antenna may include, but are not limited to, an internal antenna, an omni-directional antenna, a monopole antenna, a dipole antenna, an end-fed antenna, a circularly polarized antenna, a micro-strip antenna, a diversity antenna, a dual antenna, an antenna array, and a helical antenna.

System 400 may include a number of network devices 410-1 . . . 410-N coupled to backplane 405. In various embodiments, one or more of network interfaces 415-1 . . . 415-N 100 and/or one or more of network devices 410-1 . . . 410-N may include a processor. The processor may be implemented using any processor or logic device, such as a complex instruction set computer (CISC) microprocessor, a reduced instruction set computing (RISC) microprocessor, a very long instruction word (VLIW) microprocessor, a processor implementing a combination of instruction sets, or other processor device. The processor may also be implemented as a dedicated processor, such as a controller, microcontroller, embedded processor, a digital signal processor (DSP), a network processor, a media processor, an input/output (I/O) processor, a media access control (MAC) processor, a radio baseband processor, a field programmable gate array (FPGA), and a programmable logic device (PLD). In an embodiment, interfaces 415-1 . . . 415-N 100 and/or one or more of network devices 410-1 . . . 410-N may include a memory to connect to the processor. The memory may be implemented using any machine-readable or computer-readable media capable of storing data, including both volatile and non-volatile memory. For example, the memory may include read-only memory (ROM), random-access memory (RAM), dynamic RAM (DRAM), Double-Data-Rate DRAM (DDRAM), synchronous DRAM (SDRAM), static RAM (SRAM), programmable ROM (PROM), erasable programmable ROM (EPROM), electrically erasable programmable ROM (EEPROM), and flash memory, or any other type of media suitable for storing information.

Although specific embodiments have been illustrated and described herein, it will be appreciated by those of ordinary skill in the art that any arrangement that is calculated to achieve the same purpose may be substituted for the specific embodiments shown. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description.

What is claimed is:

1. A method comprising:

receiving data, the received data encoded in accordance with a code; and correcting burst errors in the received data using a decoder configured as a Meggitt decoder having circuitry to correct a burst error having a length larger than the maximum burst length of the code by selecting a burst error vector, according to a specified criterion, from a plurality of burst error vectors having a common burst length.

2. The method of claim 1, wherein correcting the error bursts includes:

selecting the burst error vector from the plurality of burst error vectors having the same burst length, each of the burst error vectors having a Hamming weight, by selecting one of the burst error vectors having the lowest Hamming weight; and correcting the selected burst error.

3. The method of claim 2, wherein the method includes correcting error bursts of length less than or equal to 13 for a burst error correction code (2112, 2080).

4. The method of claim 1, wherein the method includes receiving the error bursts from a backplane.

5. The method of claim 4, wherein receiving the error bursts from a backplane includes receiving the error bursts from an Ethernet backplane.

6. An apparatus comprising:

a decoder to correct burst errors in received data encoded in accordance with a code, the decoder configured as a Meggitt decoder having circuitry to correct a burst error having a length larger than the maximum burst length of the code, based on a specified criterion to select a burst error vector from a plurality of burst error vectors having a common burst length.

7. The apparatus of claim 6, wherein the decoder includes:

a syndrome calculator;

comparison circuitry coupled to the syndrome calculator;

weight determination circuitry coupled to the comparison circuitry, the weight determination circuitry to determine a minimum Hamming weight of a plurality of burst error vectors; and a codeword buffer;

an output to provide a decoded vector, the output responsive to the weight determination circuitry and to the codeword buffer.

8. The apparatus of claim 6, wherein the apparatus has an input to provide data from a backplane to the decoder.

9. The apparatus of claim 8, wherein the input includes an input to provide data from an Ethernet backplane to the decoder.

10. The system of claim 6, wherein the decoder includes a forward error correction decoder configured on a physical layer of a device.

11. A system comprising:

a backplane; and a decoder to correct burst errors in data received from the backplane, the data encoded in accordance with a code, the decoder configured as a Meggitt decoder having circuitry to correct a burst error having a length larger than the code error correction capability based on a specified criteria to select a burst error vector from a plurality of burst error vectors having a common burst length.

12. The system of claim 11, wherein the decoder includes circuitry to select a burst error vector having a lowest Hamming weight from a plurality of burst error vectors having the same burst length and circuitry to correct the selected burst error.

13. The system of claim 11, wherein the code includes a burst error correction code (2112, 2080) and the decoder corrects error bursts having a length of 13 or less.

14. The system of claim 11, wherein the backplane includes an Ethernet backplane.

15. The system of claim 11, wherein the system includes a controller to process the data decoded from the decoder.

16. The system of clam 11, wherein the decoder includes a forward error correction decoder configured on a physical layer of a network interface.

17. The system of claim 11, wherein the system is a network storage system.

18. A machine-readable medium that stores instructions, which when performed by a machine, cause the machine to:

operate on received data, the received data encoded in accordance with a code; and correct burst errors in the received data using a Meggitt decoding scheme arranged to correct a burst error having a length larger than the maximum burst length of the code by selecting a burst error vector, according to a specified criterion, from a plurality of burst error vectors having a common burst length.

19. The machine-readable medium of claim 18, wherein the instructions to correct the error bursts include instructions, which when performed by a machine, cause the machine to:

select the burst error vector from the plurality of burst error vectors having the same burst length, each of the burst error vectors having a Hamming weight, by selecting one of the burst error vectors having the lowest Hamming weight; and correct the selected burst error.

20. The machine-readable medium of claim 18, wherein the instructions to correct the error bursts include instructions, which when performed by a machine, cause the machine to correct error bursts of length less than or equal to 13 for a burst error correction code (2112, 2080).

* * * * *

UNITED STATES PATENT AND TRADEMARK OFFICE

CERTIFICATE OF CORRECTION

PATENT NO. : 8,151,165 B2
APPLICATION NO. : 12/305964
DATED : April 3, 2012
INVENTOR(S) : Andrey V. Belogolovy et al.

It is certified that error appears in the above-identified patent and that said Letters Patent is hereby corrected as shown below:

In column 10, line 6, in Claim 10, delete “system” and insert -- apparatus --, therefor.

In column 10, line 32, in Claim 16, delete “clam” and insert -- claim --, therefor.

Signed and Sealed this
Twenty-eighth Day of August, 2012

David J. Kappos
*Director of the United States Patent and Trademark Office*